(12) United States Patent
Park

(10) Patent No.: US 6,858,505 B2
(45) Date of Patent: Feb. 22, 2005

(54) METHODS OF FORMING TRANSISTOR STRUCTURES INCLUDING SEPARATE ANTI-PUNCHTHROUGH LAYERS

(75) Inventor: Byung-Jun Park, Gyeonggi-do (KR)

(73) Assignee: Samsung Electronics Co. Ltd. (KR)

(*) Notice: Subject to any disclaimer, the term of this patent is extended or adjusted under 35 U.S.C. 154(b) by 1 day.

(21) Appl. No.: 10/266,811

(22) Filed: Oct. 8, 2002

(65) Prior Publication Data

US 2004/0065936 A1 Apr. 8, 2004

(51) Int. Cl.⁷ ........................ H01L 21/336; H01L 21/76
(52) U.S. Cl. ........................ 438/301; 438/430; 438/300
(58) Field of Search ................ 438/301, 264, 438/300, 305, 430

(56) References Cited

U.S. PATENT DOCUMENTS

| | | | |
|---|---|---|---|
| 4,894,696 A | 1/1990 | Takeda et al. | 357/23.6 |
| 4,963,502 A | 10/1990 | Teng et al. | 437/41 |
| 5,547,903 A | 8/1996 | Hsu | 437/203 |
| 5,614,430 A | 3/1997 | Liang et al. | 437/45 |
| 5,766,998 A | 6/1998 | Tseng | 438/291 |
| 5,909,044 A | 6/1999 | Chakravarti et al. | 257/301 |
| 5,943,575 A * | 8/1999 | Chung | 438/300 |
| 6,071,783 A * | 6/2000 | Liang et al. | 438/301 |
| 6,200,841 B1 | 3/2001 | Kim | 438/197 |
| 6,268,256 B1 | 7/2001 | Kuo | 438/305 |
| 6,274,894 B1 | 8/2001 | Wieczorek et al. | 257/192 |
| 6,285,061 B1 | 9/2001 | Shell et al. | 257/344 |
| 6,346,729 B1 | 2/2002 | Liang et al. | 257/344 |
| 6,483,158 B1 | 11/2002 | Lee | 257/408 |

FOREIGN PATENT DOCUMENTS

| | | |
|---|---|---|
| CN | 2000-0065719 | 11/2000 |
| JP | 09129887 A | 5/1997 |
| WO | WO 00/57479 | 9/2000 |

OTHER PUBLICATIONS

Official Letter (English Translation) for corresponding German Application No. 10311702.4–33, Jul. 22, 2004.
Wolf, S., "Silicon Processing for the VLSI Era, vol. 2," Process Integration, Sunset Beach, CA 1990, pp. 341–347.
United Kingdom Search Report for Application Serial No. 0306735.2 dated Sep. 23, 2003.

* cited by examiner

Primary Examiner—John F. Niebling
Assistant Examiner—Walter L. Lindsay, Jr.
(74) Attorney, Agent, or Firm—Myers Bigel Sibley & Sajovec

(57) ABSTRACT

An integrated circuit transistor structure can include a gate electrode on a substrate and a source/drain region in the substrate adjacent to the gate electrode. An anti-punchthrough layer, separate from the substrate, is adjacent to the source/drain region.

27 Claims, 3 Drawing Sheets

METHODS OF FORMING TRANSISTOR STRUCTURES INCLUDING SEPARATE ANTI-PUNCHTHROUGH LAYERS

FIELD OF THE INVENTION

The present invention relates to the field of integrated circuits in general, and more particularly, to transistors and methods of forming transistors.

BACKGROUND

The performance of small transistors, such as MOSFETs, can be affected by a short-channel effect commonly referred to as "punchthrough." Punchthrough can be observed when a depletion region generated, for example, by the drain region of a MOSFET, contacts or comes into close proximity with an opposing depletion region generated by the opposing source region of the MOSFET. The contact of the depletion regions can cause charge to transfer between the source and drain region regardless of the voltage supplied to the gate. Therefore, MOSFETs affected by punchthrough may lose the ability to function as a switch (i.e,. to turn off completely).

It is known to compensate for the effects of punchthrough by implanting impurity ions into the substrate of the MOSFET. FIG. 1 is a graph that illustrates exemplary effects of implants in the substrate of a short channel MOSFET. In particular, curve (a) of FIG. 1 illustrates that punchthrough can develop in a MOSFET, without an ion implant, when the channel length of the MOSFET is reduced to about 0.85 μm. In contrast, curves (b) and (c) of FIG. 1 illustrate that an ion implantation into the substrate at respectively increasing dosages can suppress the onset of punchthrough until the channel length is reduced to a length approaching 0.5 μm.

FIG. 2 illustrates a MOSFET having a punchthrough region implant 200 in the substrate which can block a depletion region 205 generated, for example, by the source region, from reaching the drain region or a depletion region generated by the drain region. Accordingly, the punchthrough region implant 200 may prevent the onset of punchthrough so that the MOSFET can continue to operate reliably despite having a short channel length which might otherwise be subject to punchthrough. The following patents may be relevant to the present disclosure: U.S. Pat. No. 5,614,430 to Liang et al., entitled Anti-Punchthrough Ion Implantation for Sub-half Micron Channel Length MOSFET Devices; U.S. Pat. No. 5,766,998 to Tseng, entitled Method for Fabricating Narrow Channel Field Effect Transistors Having Titanium Shallow Junctions; U.S. Pat. No. 6,268,256 to Kuo, entitled Method for Reducing Short Channel Effect; and U.S. Pat. No. 6,285,061 to Shell et al., entitled Structure and Method for Fabricating a Field Effect Transistor with a Self-Aligned Anti-Punchthrough Implant Channel. Additional information relating to punchthrough and punchthrough implants may also be found in Wolf, S., Silicon Processing for the VLSI Era Volume 2: Process Integration, Sunset Beach, Calif., 1990.

SUMMARY

Embodiments according to the present invention can provide transistor structures and methods of forming transistor structures having anti-punchthrough layers. Pursuant to these embodiments, an integrated circuit transistor structure can include a gate electrode on a substrate and a source/drain region in the substrate adjacent to the gate electrode. An anti-punchthrough layer, separate from the substrate, is adjacent to the source/drain region.

The separate anti-punchthrough layer can prevent or reduce development of punchthrough effects. In some embodiments according to the present invention, the anti-punchthrough layer has an anti-punchthrough property which is substantially uniform across the thickness of the anti-punchthrough layer compared, for example, to that associated with a region subjected to ion implantation which may exhibit a non-uniform Gaussian distribution.

In some embodiments according to the present invention, the anti-punchthrough layer is offset from a region in the substrate beneath the channel region that is opposite the gate electrode. In some embodiments according to the present invention, the anti-punchthrough layer has a first surface that faces away from the channel region and a second surface, opposite the first surface, that faces the channel region.

In some embodiments according to the present invention, the anti-punchthrough layer is an undoped anti-punchthrough layer. In some embodiments according to the present invention, the anti-punchthrough layer is included in a MOSFET of a memory device. In some embodiments according to the present invention, the anti-punchthrough layer is an electrically insulating layer. In some embodiments according to the present invention, the anti-punchthrough layer is an oxide layer.

In some embodiments according to the present invention, a trench is formed in the substrate self-aligned to the gate electrode, wherein the anti-punchthrough layer is in the trench. In some embodiments according to the present invention, the source/drain region is in the trench. In some embodiments according to the present invention, the anti-punchthrough layer is on a side wall of the trench.

In some embodiments according to the present invention, a first semiconductor material is formed in the trench and a second semiconductor material is formed in the trench on the first semiconductor material between the gate electrode and the first semiconductor material. The second semiconductor material can be used to form the source/drain region of the transistor. In some embodiments according to the present invention, the anti-punchthrough layer is absent from a portion of a side wall of the trench adjacent to the second semiconductor material.

In method embodiments according to the present invention, transistor structures can be formed by forming a gate electrode on a substrate and forming an anti-punchthrough layer separate from the substrate adjacent to the gate electrode. A source/drain region is formed in the substrate on the anti-punchthrough layer adjacent to the gate electrode.

In some method embodiments according to the present invention, the anti-punchthrough layer can be formed by forming a trench in the substrate self-aligned to the gate electrode and forming the anti-punchthrough layer on a side wall of the trench. In some method embodiments according to the present invention, the anti-punchthrough layer can be formed by at least one of depositing or growing the anti-punchthrough layer on the side wall.

Some method embodiments according to the present invention include forming a first semiconductor material to a first level below a surface of the substrate so that a portion of the anti-punchthrough layer above the first level is exposed and removing the exposed portion of the anti-punchthrough layer so that the anti-punchthrough layer is absent from the side wall of the trench above the first level. Some method embodiments according to the present invention include forming a second semiconductor material in the trench on the first semiconductor material to a level in the trench that is coplanar with the surface of the substrate.

Some method embodiments according to the present invention include growing the first and second semiconductor materials in separate steps using silicon epitaxial growth. Some method embodiments according to the present invention include forming the source/drain region by forming the first semiconductor material in the trench and forming the second semiconductor material in the trench on the first semiconductor material. Ions can be implanted into the second semiconductor material to form the source drain region. Some method embodiments according to the present invention include forming an anti-punchthrough layer having a substantially uniform anti-punchthrough property across a thickness of the anti-punchthrough layer.

Figure 1:
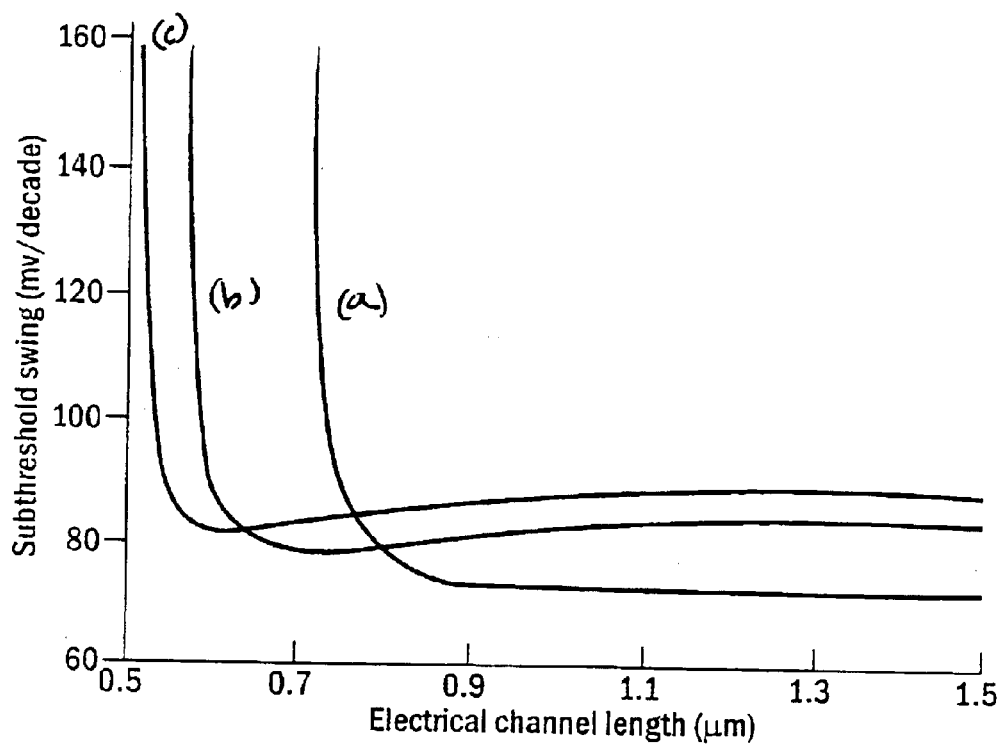
FIG. 1 is a graph that illustrates effects of ion implantation on punchthrough in MOSFETs.
Figure 2:
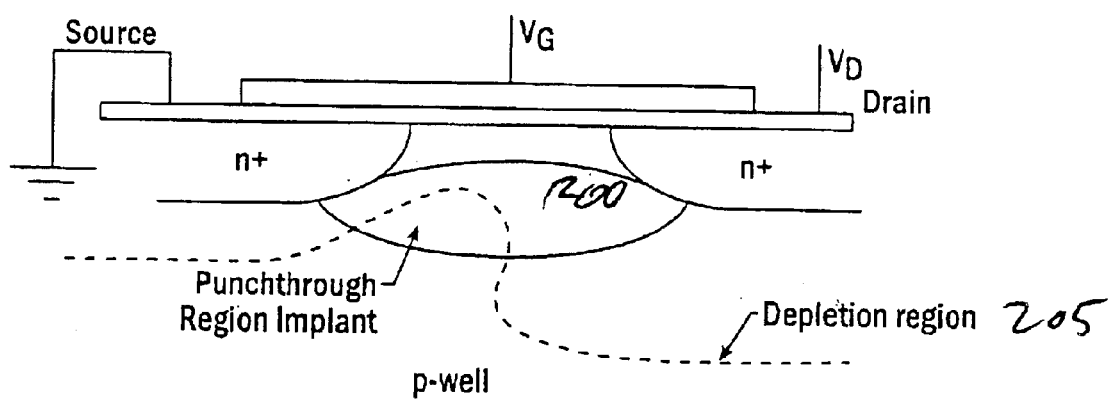
FIG. 2 is a cross-sectional view of a short channel MOSFET having an anti-punchthrough regional implant in the substrate.

DESCRIPTION OF EMBODIMENTS
ACCORDING TO THE INVENTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

It will be understood that when an element such as a layer, region or substrate is referred to as being "on" another element, it can be directly on the other element or intervening elements may also be present. In contrast, when an element is referred to as being "directly on" another element, there are no intervening elements present.

This disclosure also uses relative terms, such as "under" or "beneath," to describe some of the elements in the embodiments. These relative terms are used for the sake of convenience and clarity when referring to the drawings, but are not to be construed to mean that the elements so described can only be positioned relative to one another as shown. For example, when a first element is described as being under a second element in the viewer's frame of reference, it will be understood that the first element may also be located over the second element, if the embodiment were viewed from a different frame of reference, such as if the entire structure were inverted.

Each embodiment described and illustrated herein includes its complementary conductivity type embodiment as well. For example, even though embodiments of NMOS type devices are illustrated and described, the present invention is also applicable to embodiments of PMOS type devices. Terms used herein are to be given their ordinary meaning unless explicitly defined otherwise herein.

In embodiments according to the present invention, a separate anti-punchthrough layer in the substrate on the source/drain region can prevent or reduce contact between depletion regions which could otherwise produce punchthrough effects in the transistor. In some embodiments according to the present invention, the anti-punchthrough layer has an anti-punchthrough property which is substantially uniform across the thickness of the anti-punchthrough layer compared, for example, to that associated with a region subjected to ion implantation which may exhibit a non-uniform Gaussian distribution.

Figure 3A:
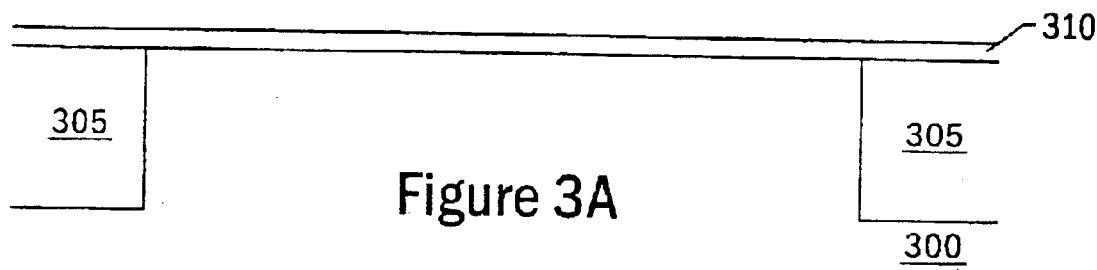
FIGS. 3A–3F are cross-sectional views that illustrate transistor structures and methods of forming transistor structures according to embodiments of the present invention.

FIG. 3A is a cross-sectional view of a substrate 300 with isolation regions 305, such as shallow trench isolation regions, formed therein. An oxide layer 310 is formed on the substrate 300 and on the isolation regions 305 using techniques known to those having skill in the art. In some embodiments according to the present invention, the substrate 300 can be P type single crystal silicon having a crystal orientation of <110>. In other embodiments according to the present invention, other types of semiconductors may be used.

Figure 3B:
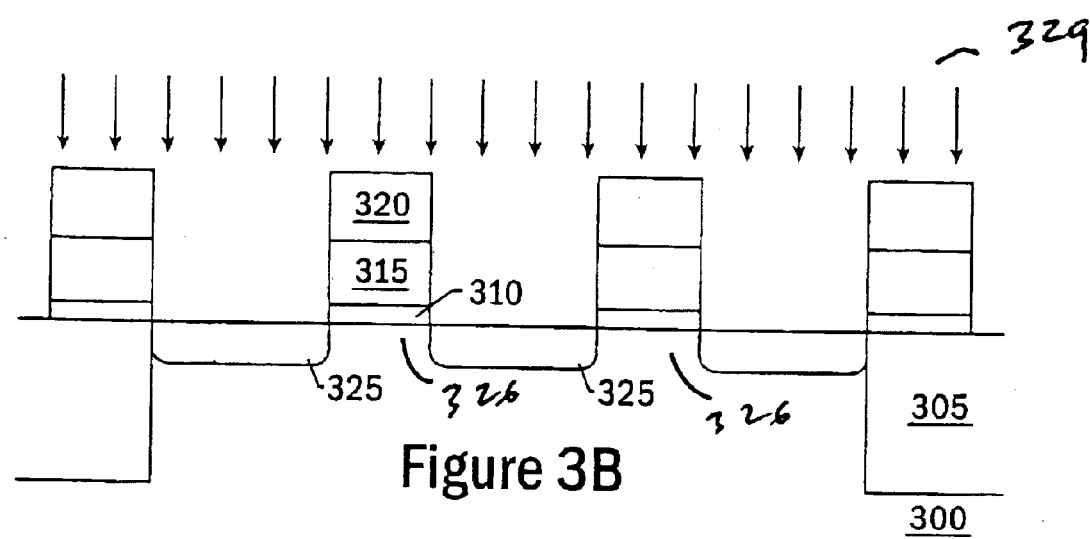

According to FIG. 3B, a gate electrode 315 and gate mask 320 are defined on the oxide layer 310 using a photolithographic process to form a gate structure that includes the oxide layer 310. First doped source/drain regions 325 are formed in the substrate 300 between the gate structures using a first ion implant 329. The ion implant is performed to provide the first doped source/drain regions 325 with a first level of doping. In some embodiments according to the present invention, the first ion implant 329 uses N type donor ions, such as phosphorous, to form N-doped source/drain regions as the first doped source/drain regions 325. A channel region 326 of the transistor is located in the substrate 300 opposite the gate-structure between the source/drain regions 325.

Figure 3C:
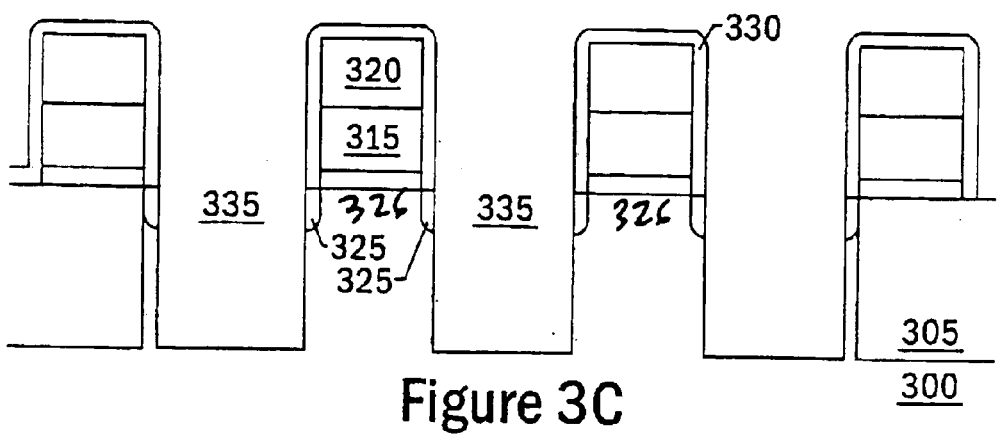

According to FIG. 3C, a capping layer 330 is formed on the gate structure and on the substrate 300. In some embodiments according to the present invention, the capping layer is a silicon dioxide. In other embodiments according to the present invention, the capping layer is a silicon nitride layer. In some embodiments according to the present invention, the capping layer 330 is formed using low pressure chemical vapor deposition. In some embodiments according to the present invention, other techniques, such as physical vapor deposition (PVD) and/or atomic layer deposition (ALD), are used to form the capping layer 330.

A trench 335 is formed in the substrate 300 self-aligned to the gate structure using the capping layer 330 as a mask. In some embodiments according to the present invention, the trench 335 is formed using anisotropic etching. In some embodiments according to the present invention, the depth of the french 335 is in range between about 1000 Å and about 2000 Å. Portions of the first doped source/drain regions 325 under the capping layer 330 adjacent to the channel region 326 are protected and are, therefore, not removed despite the removal of the substrate 300 from between the gate structures to form the trench 335.

Figure 3D:
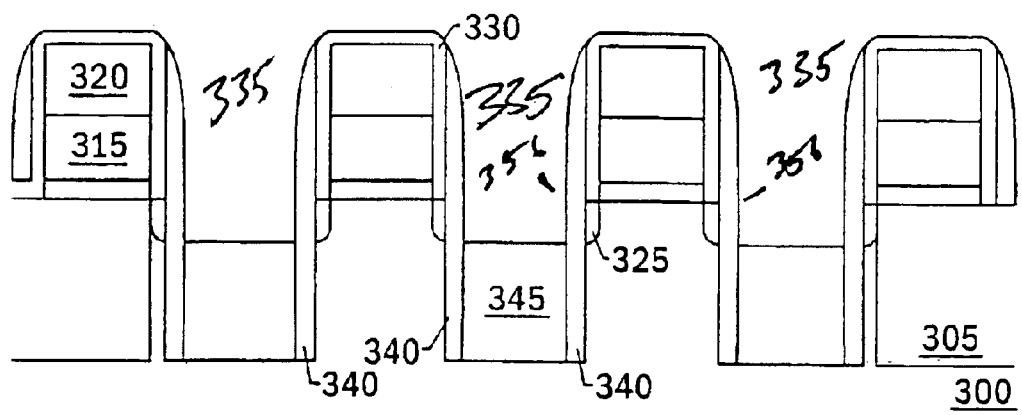

According to FIG. 3D, an anti-punchthrough layer 340 is formed on a side wall of the gate structure and on a sidewall of the trench 335. In some embodiments according to the present invention, the anti-punchthrough layer 340 is a layer in the substrate 300 which is separate therefrom. In some embodiments according to the present invention, the anti-punchthrough layer 340 can be self-aligned to the gate structure as the anti-punchthrough layer 340 is formed on the side wall of the trench 355. In some embodiments according to the present invention, the anti-punchthrough layer 340 has a first surface that faces towards the channel region 326 and a second surface, opposite the first surface, that faces away from the channel region 326. Furthermore, the anti-punchthrough layer 340 can have a cross-sectional thickness that is substantially uniform between the first and second faces. The substantially uniform thickness can be a characteristic of the way in which the anti-punchthrough layer 340 is formed. In particular, the anti-punchthrough layer 340 can be formed using techniques which can promote a uniform thickness of the material deposited or otherwise formed.

In some embodiments according to the present invention, the anti-punchthrough layer 340 is an electrically insulating layer that can prevent the further development of the depletion region between the source and drain regions. In some embodiments according to the present invention, the anti-punchthrough layer 340 is a low k type material, such as a silicon nitride layer or a silicon dioxide layer. In still other embodiments according to the present invention, the anti-punchthrough layer 340 can be other materials. It will be understood that the anti-punchthrough layer 340 can be a multi-layered structure including combinations of these types of materials. In some embodiments according to the present invention, the anti-punchthrough layer 340 can be formed using chemical vapor deposition. In some embodiments according to the present invention, the anti-punchthrough layer is thermally grown on the sidewalls.

The anti-punchthrough layer 340 can block or reduce the encroachment of a depletion region generated by a source/drain region on an opposing depletion region generated by the opposing source/drain region of the transistor to prevent or reduce the anti-punchthrough phenomenon discussed herein. In some embodiments according to the present invention, the anti-punchthrough layer 340 has an anti-punchthrough property which is substantially uniform across the thickness of the anti-punchthrough layer 340 compared, for example, to a region formed using ion implantation.

An anti-punchthrough region formed using an ion implant, such as the conventional approaches discussed above, may exhibit anti-punchthrough properties which vary in the region according to the concentration of the implant. As will be understood by those having skill in the art, ion implantation may distribute ions in the region according to a Gaussian distribution. In the embodiments according to the present invention, however, the anti-punchthrough property provided by the anti-punchthrough layer 340 is substantially uniform across the thickness of the anti-punchthrough layer 340 as the anti-punchthrough layer 340 can be formed without the use of an ion implant. Accordingly, in some embodiments according to the present invention, the anti-punchthrough layer 340 is undoped.

Although the anti-punchthrough layer 340 is described above in some embodiments as being undoped, it will be understood that during subsequent operations described herein, the anti-punchthrough layer 340 can be subjected to ion implantation when, for example, forming a source/drain region in the trench 335. It will be understood that this level of doping is incidental and will not be considered to make the anti-punchthrough layer 340 a doped layer.

Still referring to FIG. 3D, a first semiconductor material 345 is formed in the trench 335 to a level in the trench 335 that is below a junction 356 between the source/drain region 325 and the substrate 300. In some embodiments according to the present invention, the first semiconductor material 345 is formed using selective silicon epitaxial growth (SEG). In other embodiments according to the present invention, other approaches are used to form the first semiconductor material 345. In some embodiments according to the present invention, the first semiconductor material 345 can provide a heavily doped region in the trench 335 such as an N++ doped region, formed in subsequent operations.

Figure 3E:
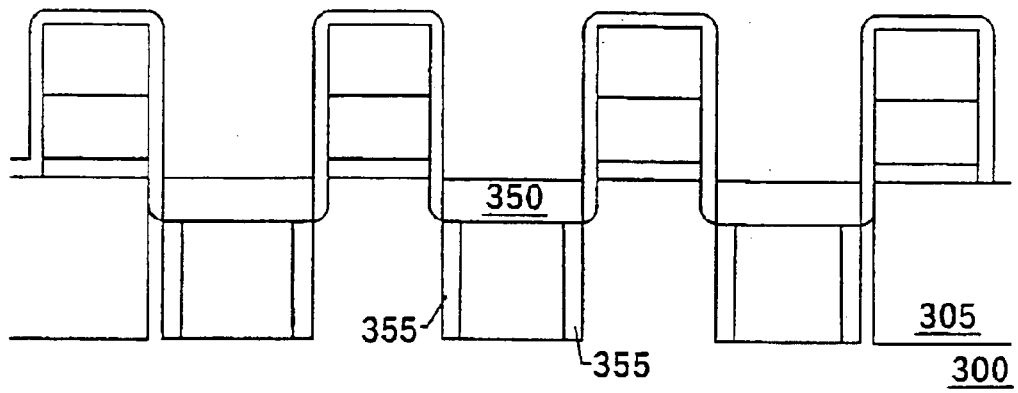

According to FIG. 3E, the portions of the anti-punchthrough layer 340 on the side wall of the gate structure and on the side wall of the trench 335 above the first semiconductor material 345 (i.e., not covered by the first semiconductor material 345 in the trench 335) are removed to expose the first doped source/drain region 325 and the capping layer 330. In some embodiments according to the present invention, the portions of the anti-punchthrough layer 340 are removed using a wet etch. In other embodiments according to the present invention, the portions of the anti-punchthrough layer 340 are removed using other techniques.

A second semiconductor material 350 is formed in the trench on the first semiconductor material 345 adjacent to the first doped source/drain region 325. The second semiconductor material 350 is formed to a level that fills the trench 335 which is coplanar with the surface of the substrate 300 surrounding the trench 335 and which is also coplanar with a surface of the first doped source/drain region 325. In some embodiments according to the present invention, the second semiconductor material 350 is formed using SEG. In other embodiments according to the present invention, other approaches are used to form the second semiconductor material 350.

Figure 3F:
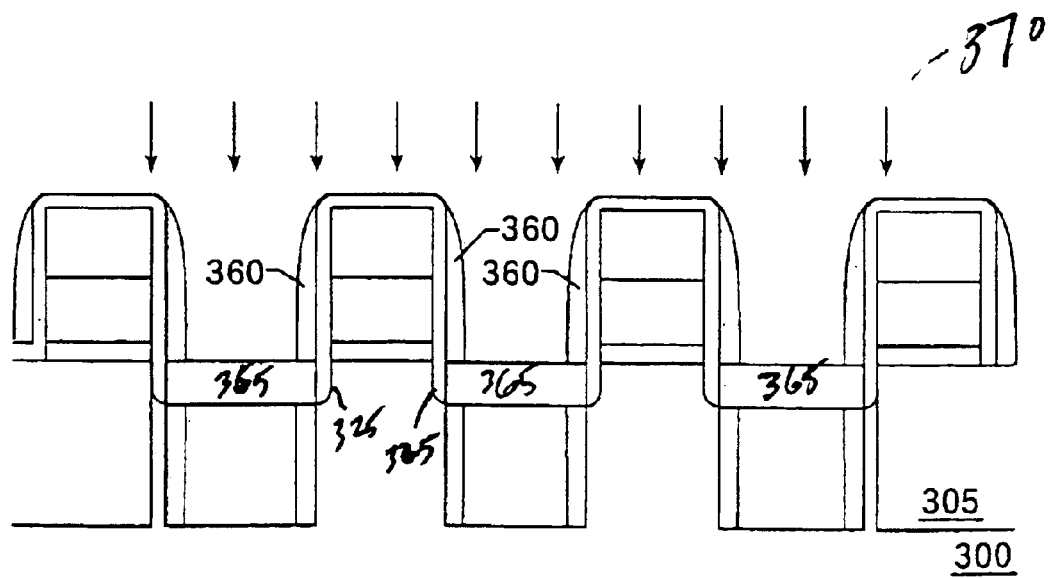

According to FIG. 3F, a spacer 360 is formed on the side wall of the gate structure. A second ion implant 370 is performed to form a second doped source/drain region 365 having a second level of doping adjacent to the first doped source/drain region 325. Accordingly, embodiments according to the present invention can provide a source/drain region of a MOSFET in the trench 335.

In some embodiments according to the present invention, the second doped/source region 365 can provide a source/drain which is more heavily doped than the first doped source/drain region 325. Accordingly, the first doped source/drain region 325 can provide a lightly doped source/drain region for the MOSFET. For example, the first level of doping associated with the first doped source/drain region 325 can N− whereas the second level of doping associated with the second doped source/drain region 365 can be N+.

In other embodiments according to the present invention, the first semiconductor material 345 is more heavily doped than the first and second doped source drain region. For example, the first semiconductor material 345 can be doped to a third doping level that is greater than the first and second levels discussed herein to provide a heavily doped N++ region beneath the second doped source/drain region 365. In some embodiments according to the present invention, the first semiconductor material 345 is doped using a third ion implant to the appropriate depth in the source/drain region beneath the second semiconductor material 350.

Although the anti-punchthrough layer 340 is shown as being on both the source/drain regions of the transistor structures illustrated in the figures, it will be understood that in some embodiments according to the present invention, the anti-punchthrough layer 340 is present on only one of the source/drain regions associated with the transistor.

According to embodiments of the present invention as discussed above, separate anti-punchthrough layer in the substrate on the source/rain region can block or reduce the encroachment of a depletion region generated by a source/ drain region on an opposing depletion region generated by the opposing source/drain region of the transistor to prevent or reduce the anti-punchthrough phenomenon discussed herein. In some embodiments according to the present invention, the anti-punchthrough layer has an anti-punchthrough property which is substantially uniform across the thickness of the anti-punchthrough layer compared, for example, to that associated with a region subjected to ion implantation which may exhibit a non-uniform Gaussian distribution.

It should be noted that many variations and modifications might be made to the embodiments described above without substantially departing from the principles of the present invention. All such variations and modifications are intended to be included herein within the scope of the present invention, as set forth in the following claims.

What is claimed:

1. A method of forming an integrated circuit transistor structure comprising:
   forming a gate electrode on a substrate;
   forming an anti-punchthrough layer separate from the substrate on the gate electrode; and
   forming a source/drain region in the substrate on the anti-punchthrough layer adjacent to the gate electrode.

2. A method according to claim 1 wherein forming the anti-punchthrough layer comprises:
   forming a trench in the substrate self-aligned to the gate electrode; and
   forming the anti-punchthrough layer on a side wall of the trench.

3. A method according to claim 2 wherein forming the anti-punchthrough layer comprises at least one of depositing or growing the anti-punchthrough layer on the side wall.

4. A method according to claim 2 wherein forming the anti-punchthrough layer comprises forming an electrically insulating layer on the side wall.

5. A method according to claim 2 wherein forming the anti-punchthrough layer comprises forming a silicon oxide layer on the side wall.

6. A method according to claim 5 further comprising:
   forming a silicon nitride layer on the silicon oxide layer.

7. A method according to claim 2 further comprising:
   forming a first semiconductor material to a first level below a surface of the substrate so that a portion of the anti-punchthrough layer above the first level is exposed; and
   removing the exposed portion of the anti-punchthrough layer so that the anti-punchthrough layer is absent from the side wall of the trench above the first level.

8. A method according to claim 7 further comprising:
   forming a second semiconductor material in the trench on the first semiconductor material to a level in the trench coplanar with the surface of the substrate.

9. A method according to claim 8 wherein forming the first semiconductor material and forming the second semiconductor material comprises growing the first and second semiconductor materials in separate steps using silicon epitaxial growth.

10. A method according to claim 1 wherein forming the source/drain region comprises:
    forming a first semiconductor material in the trench;
    forming a second semiconductor material in the trench on the first semiconductor material; and
    implanting ions into the first semiconductor material to form the source drain region.

11. A method according to claim 10 wherein implanting the ions comprises implanting first ions into the first semiconductor material at a first a dose, the method further comprising:
    implanting second ions into the first semiconductor material at second dose greater than the first dose.

12. A method according to claim 1 wherein the anti-punchthrough layer comprises a substantially uniform anti-punchthrough property across a thickness of the anti-punchthrough layer.

13. A method of forming an integrated circuit transistor structure comprising:
    forming a gate electrode on a substrate;
    forming a trench self-aligned to the gate electrode; and
    forming an anti-punchthrough layer in the trench to expose at least a portion of the substrate at a bottom of the trench.

14. A method according to claim 13 wherein forming the anti-punchthrough layer comprises:
    forming an oxide layer of a portion of a side wall of the trench;
    forming a first semiconductor material on the portion of the side wall of the trench; and
    forming a second semiconductor material in the trench on the first semiconductor material.

15. A method according to claim 14 wherein forming the first semiconductor material and forming the second semiconductor material comprises forming the first and second semiconductor materials using silicon epitaxial growth.

16. A method of forming an integrated circuit transistor structure comprising:
    forming a gate electrode on a substrate;
    implanting first ions into the substrate using gate electrode as a mask to form a first doped source/drain region at a first dose;
    forming a capping layer on the gate electrode and on the first doped source/drain region;
    forming a trench in the substrate self-aligned to the gate electrode using the gate electrode and capping layer as a mask leaving a portion of the first doped source/drain region in the substrate under the capping layer;
    forming an anti-punchthrough layer on a side wall of the trench and on a side wall of the capping layer;
    forming a first semiconductor material to a first level in the trench leaving a portion of the side wall of the trench uncovered by the first semiconductor material;
    removing the anti-punchthrough layer from the uncovered portion of the side wall and from a side wall of the gate electrode;
    forming a second semiconductor material to a second level in the trench on the first semiconductor material to cover the uncovered portion of the side wall;
    forming a spacer on the side wall of the gate electrode leaving an exposed surface of the second semiconductor material; and
    implanting second ions into the second semiconductor material to provide a second doped source/drain region at second dose that is greater than the first dose adjacent to the first doped source/drain region.

17. A method according to claim 16 further comprising: implanting third ions into the first semiconductor material.

18. A method according to claim 16 wherein forming the trench comprises forming the trench to a depth in range between about 1000 Angstrom and about 2000 Angstroms.

19. A method according to claim 16 wherein forming the first semiconductor material and forming the second semiconductor material comprises forming the first and second semiconductor material using silicon epitaxial growth.

20. A method according to claim 16 wherein forming the first semiconductor material to the first level comprises forming the first semiconductor material to below the first doped source/drain region; and wherein forming the second semiconductor material to the second level comprises forming the second semiconductor material to be coplanar with a surface of the substrate.

21. A method according to claim 16 wherein the anti-punchthrough layer comprises a silicon oxide layer.

22. A method according to claim 16 wherein the anti-punchthrough layer comprises a silicon nitride layer.

23. A method according to claim 16 wherein the anti-punchthrough layer comprises a substantially uniform anti-punchthrough property across a thickness of the anti-punchthrough layer.

24. A method of forming an integrated circuit transistor structure comprising:

forming a capping layer on a gate electrode and on a doped source/drain region;

forming a trench in the substrate self-aligned to the gate electrode using the gate electrode and capping layer as a mask leaving a portion of the doped source/drain region in the substrate under the capping layer; and forming an anti-punchthrough layer on a side wall of the trench and on a side wall of the capping layer.

25. A method according to claim 24 wherein forming the trench comprises forming the trench to a depth in range between about 1000 Angstrom and about 2000 Angstroms.

26. A method of forming an integrated circuit transistor structure comprising:

forming a gate electrode on a substrate;

forming an anti-punchthrough layer separate from the substrate adjacent to the gate electrode; and epitaxially forming a source/drain region in the substrate on the anti-punchthrough layer adjacent to the gate electrode.

27. A method of forming an integrated circuit transistor structure comprising:

forming a gate electrode on a substrate;

forming a trench in the substrate self-aligned to the gate electrode using the gate electrode as a mask; and forming an anti-punchthrough layer on a side wall of the trench and on a side wall of the gate electrode.

* * * * *